US009831827B2

(12) United States Patent
Kono et al.

(10) Patent No.: US 9,831,827 B2
(45) Date of Patent: Nov. 28, 2017

(54) PHOTOVOLTAIC INSPECTION SYSTEM AND PHOTOVOLTAIC INSPECTION METHOD

(71) Applicant: Hitachi Systems, Ltd., Shinagawa-ku, Tokyo (JP)

(72) Inventors: Toru Kono, Tokyo (JP); Yoshihito Narita, Tokyo (JP); Kentarou Oonishi, Tokyo (JP); Minoru Kaneko, Tokyo (JP); Daisuke Katsumata, Tokyo (JP)

(73) Assignee: Hitachi Systems, Ltd., Shinagawa-ku, Tokyo (JP)

( * ) Notice: Subject to any disclaimer, the term of this patent is extended or adjusted under 35 U.S.C. 154(b) by 0 days.

(21) Appl. No.: 14/911,787

(22) PCT Filed: Aug. 13, 2013

(86) PCT No.: PCT/JP2013/071860
§ 371 (c)(1),
(2) Date: Apr. 5, 2016

(87) PCT Pub. No.: WO2015/022728
PCT Pub. Date: Feb. 19, 2015

(65) Prior Publication Data
US 2016/0218668 A1 Jul. 28, 2016

(51) Int. Cl.
*G01R 31/26* (2014.01)
*H02S 50/00* (2014.01)
(Continued)

(52) U.S. Cl.
CPC .............. *H02S 50/00* (2013.01); *H01L 22/00* (2013.01); *H01L 31/02021* (2013.01); *H01L 31/042* (2013.01); *Y02E 10/50* (2013.01)

(58) Field of Classification Search
CPC ......... F21S 8/006; G01R 31/26; G01R 31/40; G01R 31/42; H01L 22/00; H01L 31/04; H01L 51/0031
(Continued)

(56) References Cited

U.S. PATENT DOCUMENTS 5,669,987 A 9/1997 Takehara et al.
2011/0204900 A1* 8/2011 Beck ..................... H02S 50/10
324/537
(Continued)

FOREIGN PATENT DOCUMENTS

JP H07-334767 A 12/1995
JP 2002-280585 A 9/2002
(Continued)

OTHER PUBLICATIONS

JP 2002280585 Machine Translation, Sep. 27, 2002.*
(Continued)

*Primary Examiner* — Huy Q Phan
*Assistant Examiner* — Raul Rios Russo
(74) *Attorney, Agent, or Firm* — McCormick, Paulding & Huber LLP

(57) ABSTRACT

A photovoltaic inspection system is provided, the photovoltaic inspection system detecting a failure by eliminating ON/OFF operation of a switch or others at the time of inspection or checkup as much as possible, reducing an influence of a temperature distribution as a whole with a small effort, and detecting a local deterioration in a photovoltaic module or string. According to a typical embodiment, in a photovoltaic system having a plurality of photovoltaic strings formed of one or a plurality of photovoltaic modules arranged to be aligned, a photovoltaic inspection system which detects the failure in the photovoltaic strings includes: a current detector which measures each of a first
(Continued)

output current of a first photovoltaic string and a second output current of a second photovoltaic string; and a monitoring unit which calculates a second temperature property of the second photovoltaic string based on a value of the first output current and a value of the second output current and which determines whether the second photovoltaic string has the failure or not based on the second temperature property.

9 Claims, 16 Drawing Sheets

(51) Int. Cl.
  *H01L 21/66* (2006.01)
  *H01L 31/02* (2006.01)
  *H01L 31/042* (2014.01)
(58) Field of Classification Search
  USPC ......... 324/71, 378, 403, 415, 425, 500, 537, 324/761.01
  See application file for complete search history.

(56) References Cited

U.S. PATENT DOCUMENTS

| | | | |
|---|---|---|---|
| 2011/0204916 A1 | 8/2011 | Beck | |
| 2012/0048326 A1* | 3/2012 | Matsuo | H02S 50/10 136/244 |
| 2012/0299576 A1 | 11/2012 | Kasai et al. | |
| 2013/0285670 A1* | 10/2013 | Yoshidomi | G01R 31/025 324/510 |
| 2013/0307556 A1* | 11/2013 | Ledenev | H02S 50/10 324/509 |
| 2014/0001865 A1* | 1/2014 | Osterloh | H01L 31/02021 307/77 |
| 2015/0188487 A1* | 7/2015 | Yoshidomi | H02S 50/10 324/761.01 |

FOREIGN PATENT DOCUMENTS

| | | |
|---|---|---|
| JP | 2004-22597 A | 1/2004 |
| JP | 2010-123880 A | 6/2010 |
| JP | 2011-146472 A | 7/2011 |
| JP | 2011-187807 A | 9/2011 |
| JP | 2012-191000 A | 10/2012 |
| JP | 2013-55132 A | 3/2013 |
| JP | 2013-65797 A | 4/2013 |

OTHER PUBLICATIONS

Communication Pursuant to European Patent Application No. 13891559.0-1555 dated Jan. 26, 2017.
International Search Report for PCT Serial No. PCT/JP2013/071860 dated Aug. 29, 2013.

* cited by examiner

PHOTOVOLTAIC INSPECTION SYSTEM AND PHOTOVOLTAIC INSPECTION METHOD

CROSS REFERENCE TO RELATED APPLICATIONS

This application is entitled to the benefit of and incorporates by reference subject matter disclosed in International Patent Application No. PCT/JP2013/071860 filed Aug. 13, 2013.

TECHNICAL FIELD

The present invention relates to a photovoltaic technique, and, more particularly, the present invention relates to a technique effectively applied to a photovoltaic inspection system and photovoltaic inspection method of detecting a failure in a photovoltaic (PV) module or string.

BACKGROUND ART

In recent years, by the introduction of FIT (Feed-in Tariffs) or others, the market of a large-scale photovoltaic system which is so-called mega solar system or others having an output equal to or larger than 1 megawatt has been expanded. In the mega solar system, several thousands to several tens of thousands of sheets of a PV module whose class is 100 W to 200 W is arranged at one location in a PV power site.

As a method of detecting a failure in a PV module, there are methods such as inspecting a deterioration of a cell by visual inspection, a method of detecting the presence or absence of abnormal heat generation of a cell by a thermometer, and a method of inspecting electrical property such as current-voltage property by a tester. These inspections are normally performed to each of a PV module or PV string (hereinafter, simply referred to as a "PV module" in some cases).

As a technique related to this, for example, Japanese Patent Application Laid-Open Publication No. 2010-123880 describes a technique of determining whether a failure has occurred in the PV module or not by providing measuring means and communicating means for each PV module or string, transmitting a measured property value and an identification signal of the PV module to a control device, and comparing the transmitted result with a previously-set threshold.

Also, Japanese Patent Application Laid-Open Publication No. 2011-146472 describes a technique of determining a high-temperature portion on a surface of a PV array as failure by an imaging machine which performs infrared-ray imaging of the surface of the PV array, by a moving mechanism which moves the imaging machine, by an observation monitor which displays an image obtained by the infrared-ray imaging by the imaging machine moved by the moving mechanism, and by a control device which controls the infrared-ray imaging of the imaging machine and the movement of the moving mechanism.

SUMMARY

According to a conventional technique, the failure of the PV module in the PV system can be detected efficiently to some extent.

However, for example, the technique as described in Japanese Patent Application Laid-Open Publication No. 2010-123880 has a problem of high cost since it is required to provide the measuring means and the communicating means for each PV module or string. It is possible to take a method of sequentially performing the measurement while manually connecting the measuring means and the communicating means to the PV module as a measurement target, and then, switching the connection to another PV module. However, the method is inefficient in a large-scale system such as a mega solar system, and besides, has a risk such as switching error between ON and OFF of a switch at the time of the connection switching.

Furthermore, although a threshold setting method is not particularly mentioned, a failure may not be detected if the set threshold is too large. Conversely, if the set threshold is too small, there is a high possibility of occurrence of such erroneous detection that a failure is determined even through the state is normal, and therefore, accuracy of failure detection is decreased. Therefore, it is required to set an appropriate threshold. However, since the property of the PV module are changed by fluctuations in the amount of solar radiation and temperature, it is very difficult to set the appropriate threshold.

Still further, for example, the technique as described in Japanese Patent Application Laid-Open Publication No. 2011-146472 has a problem of high cost again since it is required to install a rail or others T the mega solar site as a moving mechanism which moves an imaging machine such as an infrared-ray camera. Still further, even if the failure portion becomes a high-temperature portion, the difference in temperature from a normal portion is about 5° C., and even the difference in temperature of about 5° C. can be detected by local observation. However, in the technique as described in Patent Document 2, particularly in the case of the large-scale PV module such as the mega solar system, such a difference may be hidden in a temperature distribution (which is generally about 40° C. to 90° C.) as a whole, and may not be detectable.

Thus, an object of the present invention is to provide a PV inspection system and a PV inspection method of detecting a failure by eliminating the ON/OFF operation of the switch or others in the inspection or checkup as much as possible, reducing an influence of a temperature distribution as a whole with a small effort, and detecting a local deterioration in a PV module or string.

The above and other object and novel characteristics of the present invention will be apparent from the description of the present specification and the accompanying drawings.

The typical summary of the inventions disclosed in the present application will be briefly described as follows.

In a PV system having such a structure that a plurality of PV strings formed of one or a plurality of series-connected PV modules are arranged to be connected in parallel to each other, a PV inspection system according to a typical embodiment of the present invention is a PV inspection system which detects a failure in the PV strings, and has: a current detector which measures each of a first output current of a first PV string and a second output current of a second PV string; and a monitoring unit which calculates a second temperature property of the second PV string based on a value of the first output current and a value of the second output current and which determines whether the second PV string has a failure or not based on the second temperature property.

The effects obtained by typical aspects of the present invention will be briefly described below.

That is, according to the typical embodiment of the present invention, a failure can be detected by eliminating the ON/OFF operation of the switch or others in the inspection or checkup as much as possible, reducing an influence of a temperature distribution as a whole with a small effort, and detecting a local deterioration in a PV module or string.

BRIEF DESCRIPTIONS OF THE DRAWINGS

DETAILED DESCRIPTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 13:
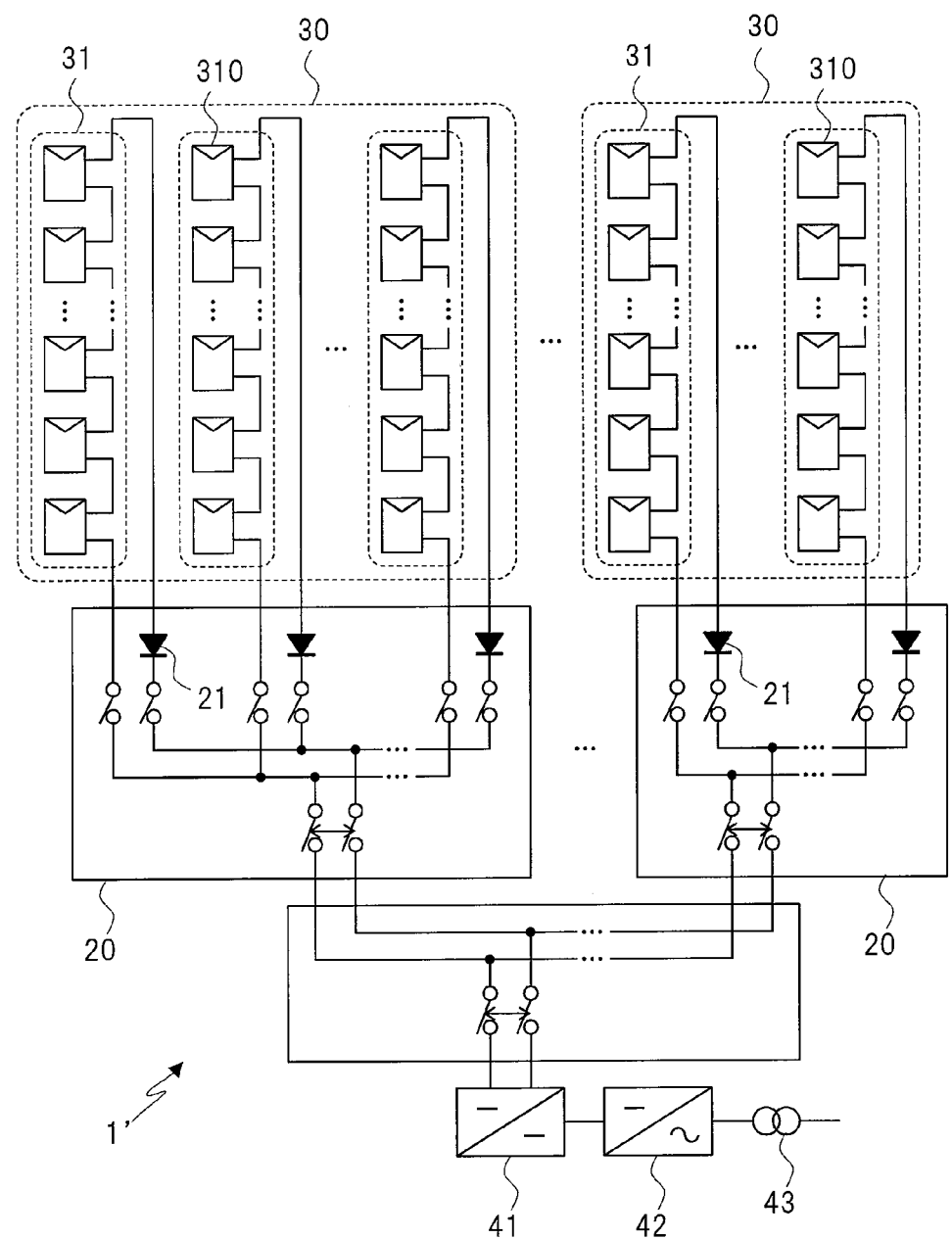
FIG. 13 is a diagram showing a general outline about an example of structure of a PV system.

FIG. 13 is a diagram showing a general outline about an example of structure of a general PV system. A PV system 1' has such a structure that one or more PV strings 31 having a plurality of series-connected PV modules 310 are connected in parallel to each other via wire connection in a connection box 20, are further integrated, and are connected to an electric power system 43 via a DC/DC converter 41 and an inverter 42 or a PCS (Power Conditioning System) including them although not shown. In this manner, electric power generated by each PV string 31 can be outputted to the electric power system 43. The plurality of parallel-connected PV strings 31 may be arranged to configure a PV array 30, and the connection box 20 may be provided for each PV array 30. In the connection box 20, note that a backflow preventing diode 21 is connected in order to prevent backflow of the current generated in each PV string 31.

Figure 14:
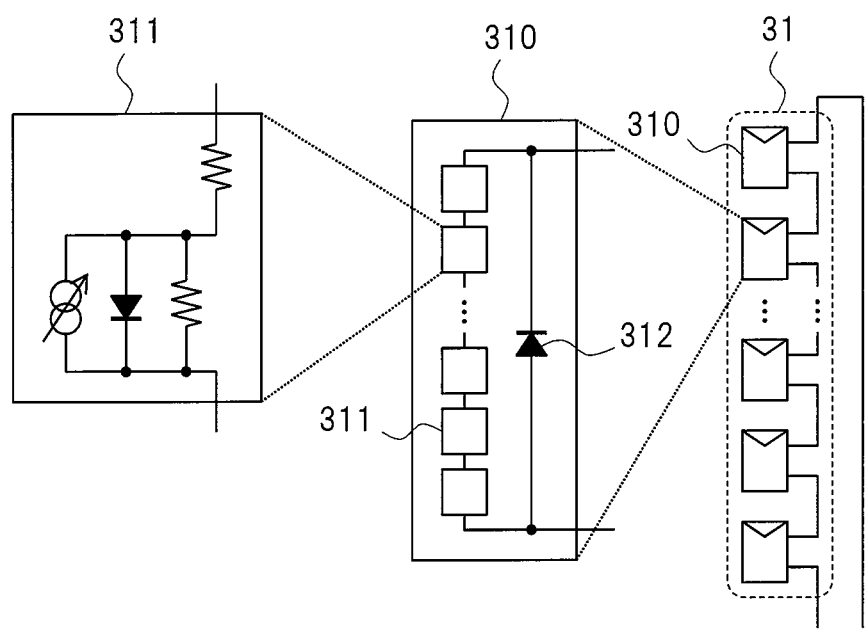
FIG. 14 is a diagram showing a general outline about an example of structure of a PV string.

FIG. 14 is a diagram showing a general outline about an example of structure of the general PV string 31. The PV string 31 shown on the right side in the drawing has such a structure that the plurality of PV modules 310 are connected in series as described above. Each PV module 310 has such a structure that a plurality of PV cells 311 are connected in series, and besides, that a bypass diode 312 used in the failure or others is connected in parallel to the PV cells. Each PV cell 311 is formed of a semiconductor element or others which converts sunlight into electric power, and is expressed by an equivalent circuit as shown on the left side in the drawing as a so-called PV (PhotoVoltaic) cell model.

Figure 15:
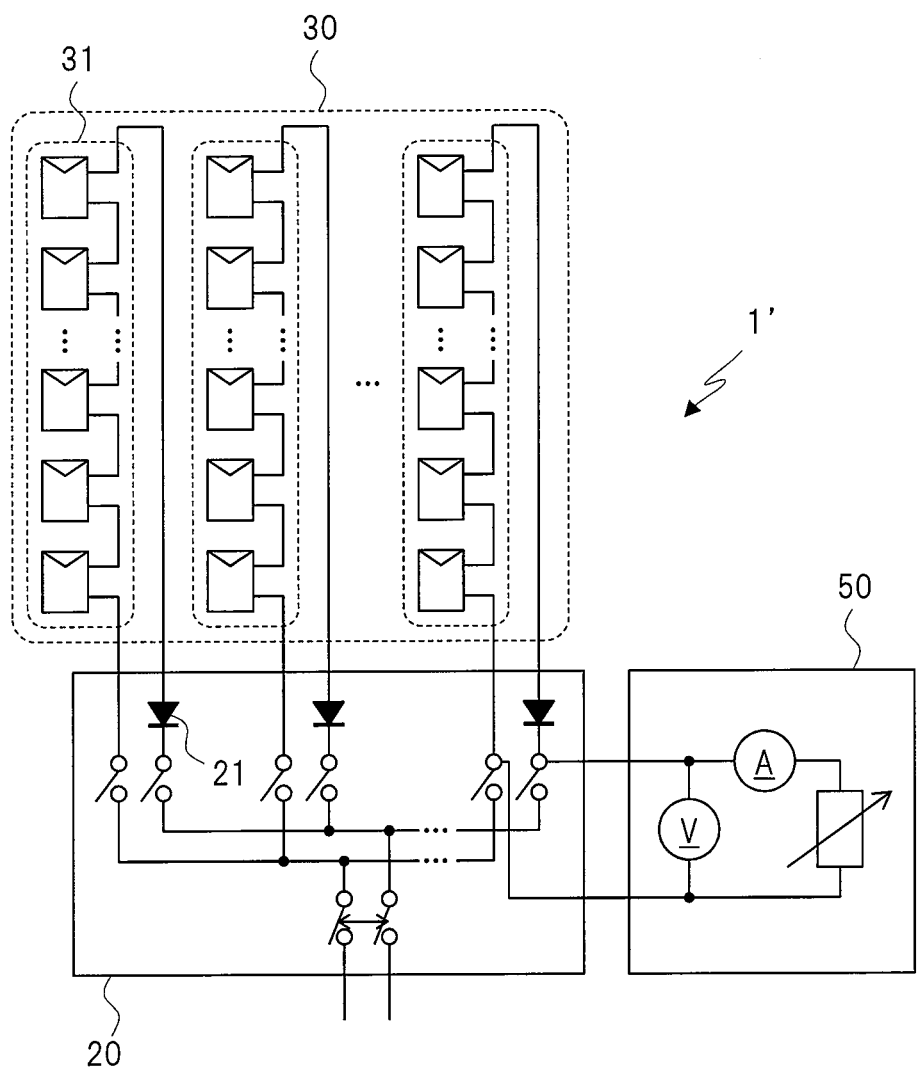
FIG. 15 is a diagram showing a general outline about an example of a mechanism of detecting a failure in each PV string in a conventional technique.

FIG. 15 is a diagram showing a general outline about an example of a mechanism which detects a failure in each PV string 31 in the general PV system 1' in the conventional technique. The example of FIG. 15 shows such a that a current-voltage property is measured for each PV string 31 by sequentially connecting a current-voltage property measuring device 50 having electronic load, an ammeter and a voltmeter connected as shown in the drawing to a terminal corresponding to the respective PV strings 31 in the connection box 20. As described above, the conventional technique takes such a mechanism that a failure is detected based on a difference state from a normal state by obtaining a current-voltage property by measuring a current and a voltage for each PV string 31.

Figure 16:
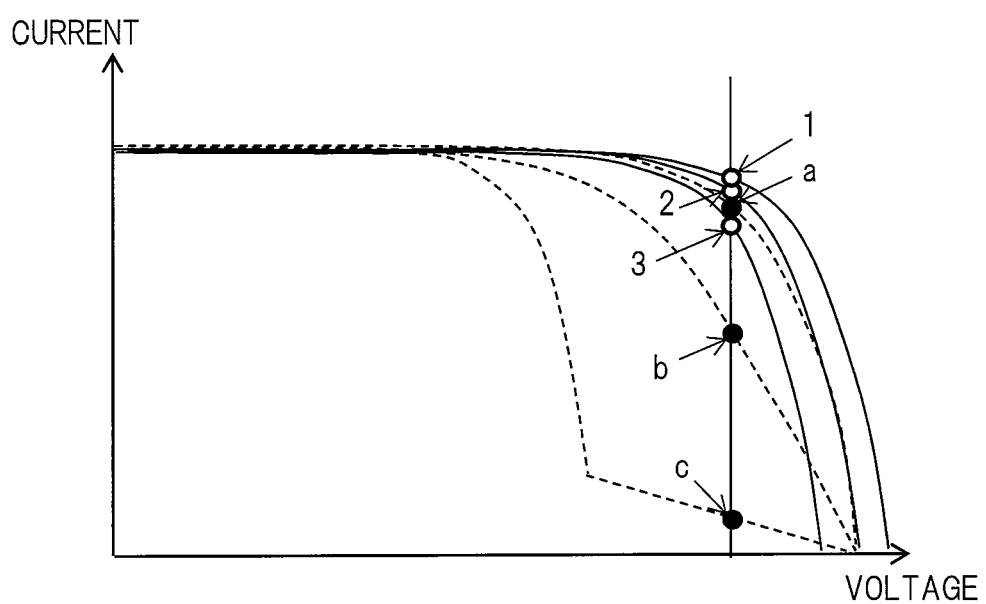
FIG. 16 is a diagram showing a general outline about an example of a current-voltage property of a PV string in the PV system.

FIG. 16 is a diagram showing a general outline about an example of the current-voltage property of the PV string in the general PV system 1'. A plurality of property curves in the drawing indicate differences in property depending on temperature. The vertical line shown on a voltage axis indicates a measurement reference voltage. This reference voltage can be set as, for example, an operating voltage in the PV string 31. Here, curves of solid-lines having intersection points with the vertical line indicating the reference voltage as represented by white circles 1 to 3 indicate a pattern of the current-voltage property at normal time. In this case, current values in a range indicated by the white circles 1 to 3 at the reference voltage can be regarded as current values in a normal range.

Meanwhile, curves of dotted lines having intersection points with the vertical line indicating the reference voltage as represented by black circles "a" to "c" indicate a pattern of the current-voltage property in failure, anomaly, deterioration, or others (hereinafter, collectively referred to as a "failure" in some cases). Here, in the curves corresponding to the black circles "b" and "c", current values at the reference voltage largely differ and decrease from the current values in the normal range indicated by the above-described white circles 1 to 3. In such a clear case, the failure can be easily detected by simple comparison between the current values. However, in the curve corresponding to the black circle "a", in spite of the failure, the current value at the reference voltage does not differ from the current values in the normal range indicated by the above-described white circles 1 to 3, and therefore, the curve indicates that it is difficult to detect the failure from the measurement of the current-voltage property.

This is because the temperature affects the current-voltage property, that is, because the current-voltage property has a temperature property, and a large-scale system with a very large area such as a mega solar system has a possibility of a large difference in temperature distribution depending on the location, and therefore, this shows that the failure cannot be accurately detected unless the influence of the temperature distribution is cancelled. However, for example, in such a method as keeping the current-voltage property at normal time for each temperature, process are complexed, and the required data amount increases.

Thus, the PV inspection system of one embodiment of the present invention determines the failure by, for example, for each PV string 31 of the PV system, obtaining a difference in the temperature property between another string adjacent or close to the string, calculating a temperature property of each PV string 31 based on this obtained difference, and comparing the temperature property and an assumed temperature property. Between the PV strings 31 adjacent or close to each other, the difference in temperature is small, and the difference can be ignored. Therefore, even in the large-scale system such as the mega solar system, the influence of the difference in temperature distribution depending on the location can be cancelled. Also, as described later, since a difference in temperature property between the PV strings 31 adjacent or close to each other can be calculated only from the current of each PV string 31, the voltage measurement is not required, so that the accuracy of failure detection can be improved while measurement is facilitated to reduce the cost.

Figure 1:
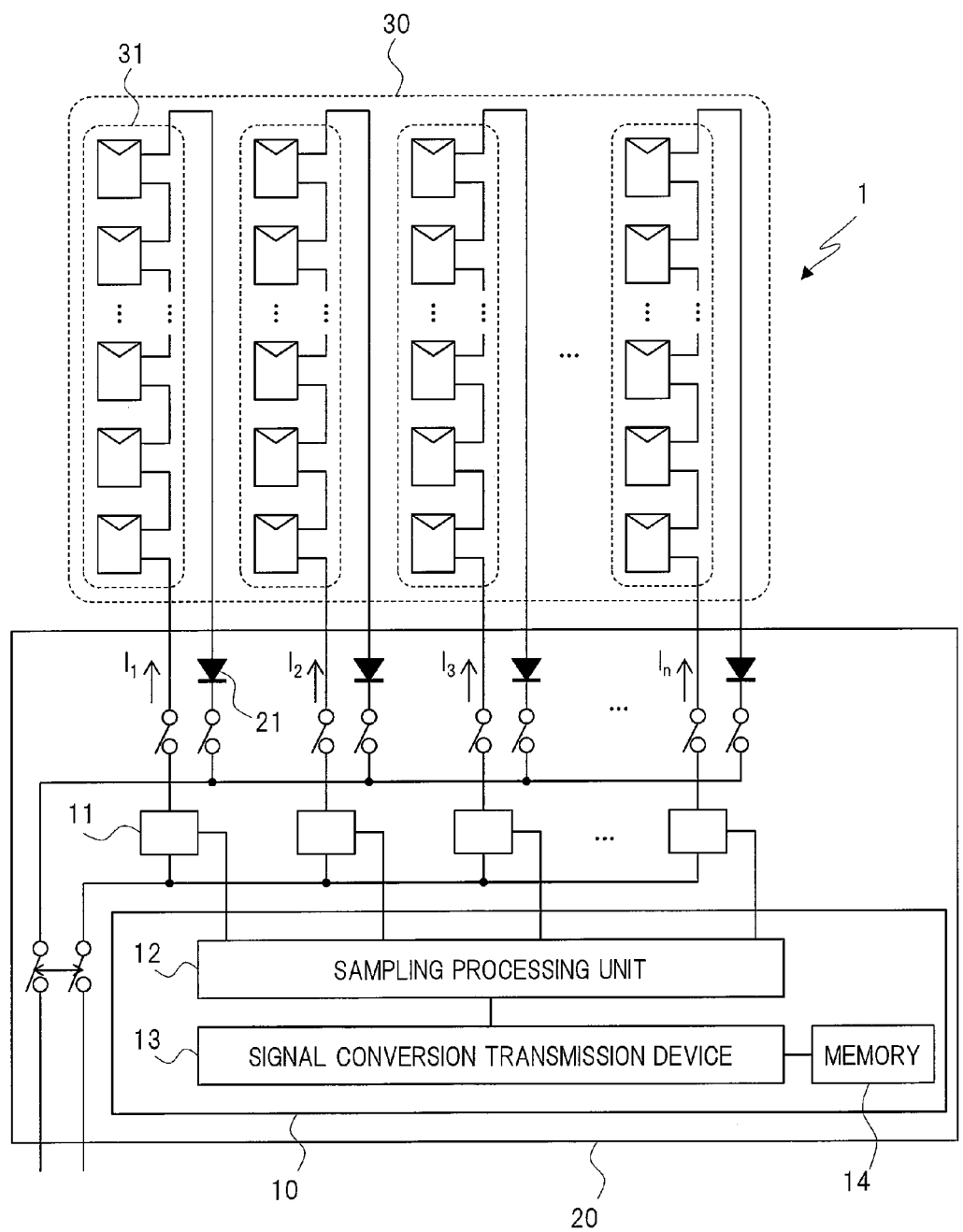
FIG. 1 is a diagram showing a general outline about an example of structure of a PV system having a PV inspection system according to a first embodiment of the present invention.

FIG. 1 is a diagram showing a general outline about an example of structure of a PV system having a PV inspection system according to a first embodiment of the present invention. In the structure of the general PV system 1' shown in FIG. 13, a PV system 1 of the present embodiment has, for example, a string monitor 10 which measures and collects a current of each PV string 31 inside the connection box 20. This string monitor 10 is a device configuring a part or entire of the PV inspection system, and may be fixedly installed inside the connection box 20 or may be configured so as to be attachable to the inside of the connection box 20 at the time of process of failure detection as a portable type.

The string monitor 10 has current detectors 11 each which measures an output current of each PV string 31, a sampling processing unit 12 which obtains the output current measured at each current detector 11 at every constant time, a signal conversion transmission device 13 which converts a signal indicating the current value obtained by the sampling processing unit 12 into predetermined output information and outputs the signal, and a memory 14 which records the information about the current value transmitted from the signal conversion transmission device 13.

The information about the current value of each PV string 31 recorded in the memory 14 can be taken out, for example, via an external terminal such as a USB (Universal Serial Bus) terminal included in the string monitor 10 but not shown to an external storage device such as a USB memory.

Then, data is taken from the external storage device into a monitoring device or monitoring unit configured of a PC (Personal Computer), a server device, or others but not shown, so that it can be determined whether the failure has occurred or not by a method as described later. It is also possible to make such a structure as directly transmitting the data by the communicating means to the monitoring device or the monitoring unit not via the memory 14. Also, the failure can be determined on the string monitor 10 by, for example, providing a CPU (Central Processing Unit) and a program on the string monitor 10 or by using a microcomputer or others to configure a monitoring unit not shown.

Figure 2:
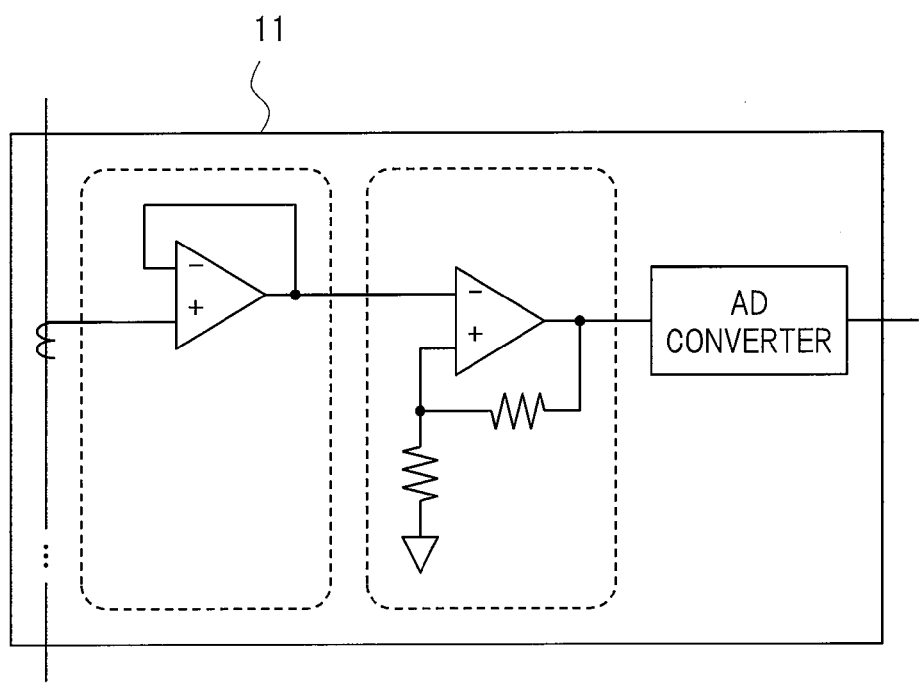
FIG. 2 is a diagram showing a general outline about an example of structure of a current detector in the first embodiment of the present invention.

FIG. 2 is a diagram showing a general outline about an example of structure of the current detector 11. The current detector 11 can be configured by using, for example, a clamp-type circuit such as a general CT (Current Transformer) sensor formed of a circuit as shown in the drawing, and can measure the current without requiring a connection operation of opening a line from each PV string 31.

Figure 3:
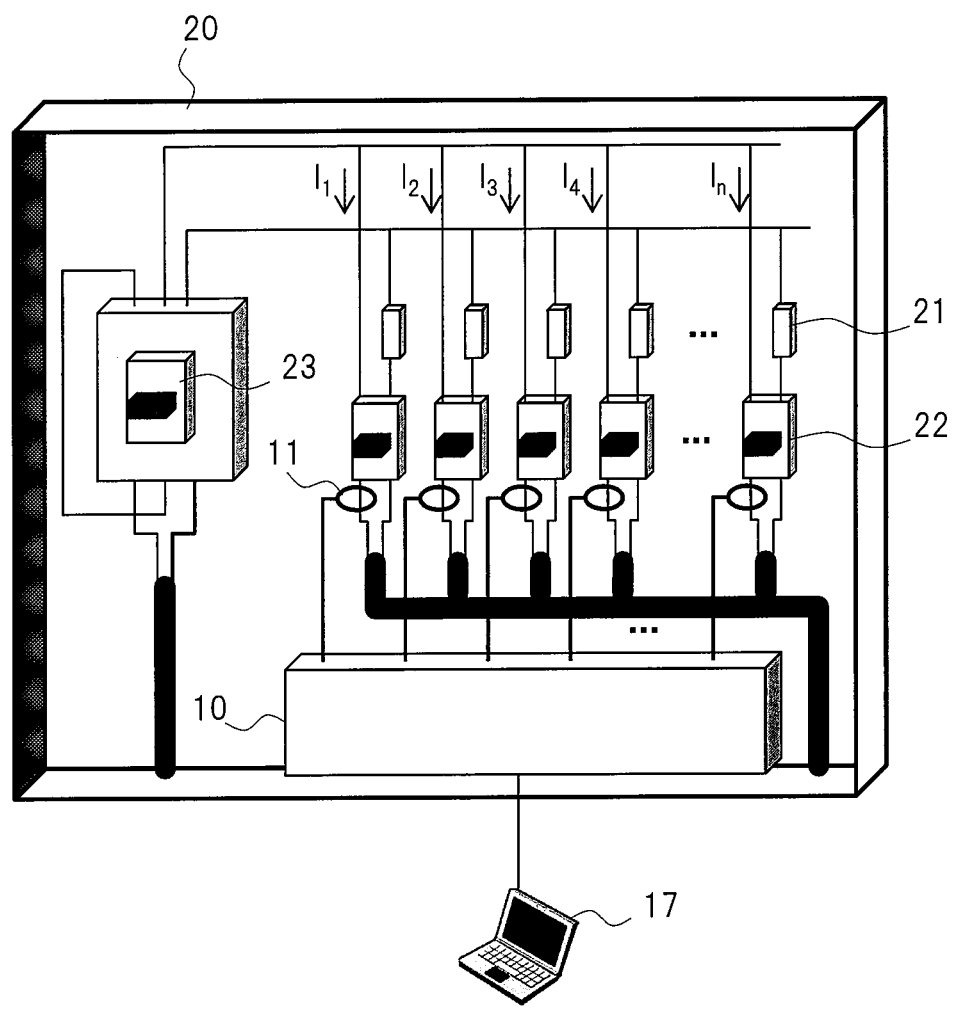
FIG. 3 is a diagram schematically showing a general outline about a specific example of structure at the time of inspection in the first embodiment of the present invention.

FIG. 3 is a diagram schematically showing a general outline about a specific example of structure at the time of inspection. Inside the connection box 20, backflow preventing diodes 21 and MCCBs (wiring breakers) 22 are installed to wirings from the respective PV strings 31, and the current detectors 11 such as CT sensors which measure output currents $I_1$ to $I_n$ from the respective PV strings 31 are installed thereto. Furthermore, a MCCB 23 for the PV array 30 is also installed. The string monitor 10 collects current values measured by the respective current detectors 11, and outputs data to, for example, a monitoring device 17 such as a PC. In the monitoring device 17, the failure is detected based on the taken data by a method described later.

The following explanation is made about a method of detecting the failure from the current value of each PV string 31 measured by the string monitor 10. As described above, in the present embodiment, the temperature property of each PV string 31 is obtained based on the difference in temperature property between the PV strings 31 adjacent or close to each other among the plurality of PV strings 31 arranged to be aligned, and it is determined whether the failure has occurred or not based on the temperature property.

Figure 4:
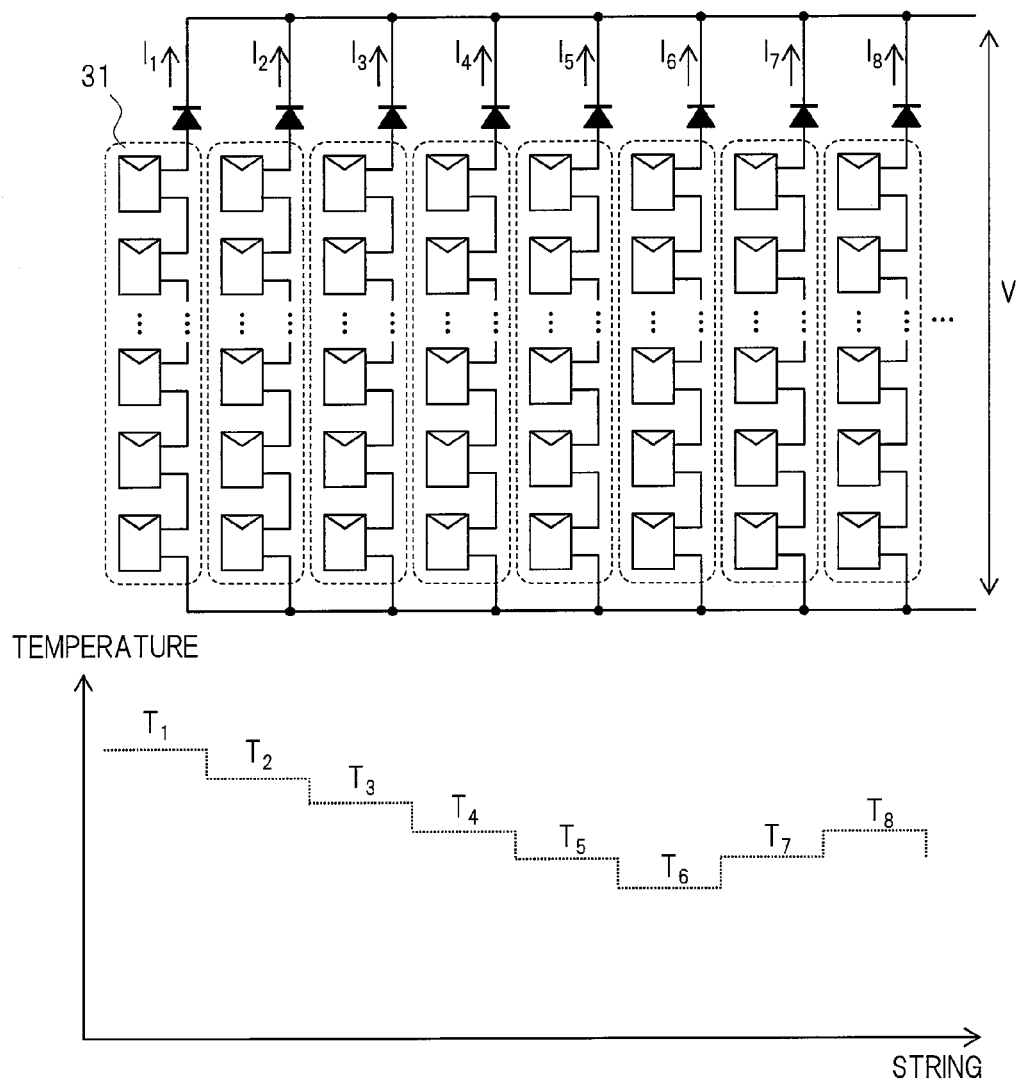
FIG. 4 is a diagram showing an example in which a temperature property of a current-voltage property of a plurality of PV strings 31 arranged to be aligned in the first embodiment of the present invention.

FIG. 4 is a diagram showing an example of obtaining the temperature property of the current-voltage property of the plurality of PV strings 31 arranged to be aligned. For the plurality of PV strings 31 arranged to be aligned, when the current values of the respective strings are set to $I_1$, $I_2$, $I_3$, . . . , when the voltage values thereof are set to $V_1$, $V_2$, $V_3$, . . . , and when the temperatures thereof are set to $T_1$, $T_2$, $T_3$, . . . , sequentially from a left end in the drawing, it has been known that a temperature property of a current-voltage property for each PV string 31 and an i-th PV string 31 can be expressed by the following formulas.

$$V_1 = N_{cell} \cdot \frac{n \cdot k \cdot T_1}{q} \cdot \ln\left(\frac{I_{sc} \cdot p_a - I_1}{I_{s1}}\right)$$

$$V_2 = N_{cell} \cdot \frac{n \cdot k \cdot T_2}{q} \cdot \ln\left(\frac{I_{sc} \cdot p_a - I_2}{I_{s2}}\right)$$

$$V_i = N_{cell} \cdot \frac{n \cdot k \cdot T_i}{q} \cdot \ln\left(\frac{I_{sc} \cdot p_a - I_i}{I_{si}}\right)$$

[Mathematical Formula 1]

In the formulas for the above-described i-th PV string 31, terms $V_i$, $I_i$, $T_i$, and $I_{si}$ are a voltage of the i-th PV string 31, a current thereof, a temperature thereof, and a saturation current thereof in a reverse direction, respectively. Also, a term $N_{cell}$ is the number of PV cells 311 included in the PV string 31, and terms n, k, and q are constants. Furthermore, a term $I_{sc}$ is a standard short-circuit current, and a term $p_a$ is a solar radiation amount. The solar radiation amount $p_a$ can be presumptively calculated from the following formula.

$$p_a = \frac{I_{op\_t}}{j} \cdot \frac{1}{I_{sc}} \quad \left(j = \frac{I_{op}}{I_{sc}}\right) \quad \text{[Mathematical Formula 2]}$$

In the above-described formula, a term $I_{op}$ is an operating current, a term $I_{SC}$ is a short-circuit current, and a ratio j therebetween is constant. Therefore, if a term $I_{op\_t}$ which is a total current of the respective PV strings 31 as a whole can be obtained, an assumed solar radiation amount $p_a$ can be calculated.

Here, consideration is made for the difference in temperature property of the current-voltage property expressed by the Mathematical Formula 1 between the i-th PV string 31 and its adjacent i+1-th PV string 31. In this case, as shown in FIG. 4, while the temperature distributions ($T_1$, $T_2$, $T_3$, . . . ) for the respective PV strings 31 are not uniform, the temperature differences ($T_2-T_1$, $T_3-T_2$, $T_4-T_3$, . . . $T_{i+1}-T_i$) between the PV strings 31 adjacent to each other can be regarded as being small as much as being ignored, and therefore, are regarded as 0, so that the difference in temperature property is approximately expressed by the following formulas.

$$\begin{cases} V_i = N_{cell} \cdot \frac{n \cdot k \cdot T_i}{q} \cdot \ln\left(\frac{I_{sc} \cdot p_a - I_i}{I_{si}}\right) \\ V_{i+1} = N_{cell} \cdot \frac{n \cdot k \cdot T_{i+1}}{q} \cdot \ln\left(\frac{I_{sc} \cdot p_a - I_i}{I_{si+1}}\right) \end{cases} \quad \text{[Mathematical Formula 3]}$$

$$\frac{\partial(V_{i+1} - V_i)}{\partial T} = N_{cell} \cdot \frac{n \cdot k}{q} \cdot \ln\left(\frac{I_{sc} \cdot p_a - I_{i+1}}{I_{sc} \cdot p_a - I_i}\right)$$

The formula expressed on the right side of the above-described formula does not include the voltage and the temperature as parameters, and can be obtained only from the current values of the i-th and i+1-th PV strings 31. This value, that is, a difference in temperature property expressed on the left side of the above-described formula becomes approximately 0 if each of the i-th and i+1-th PV strings 31 is normal.

Meanwhile, when one of the adjacent PV strings 31 includes a PV module 310 with the failure, a voltage higher than that at the normal state is detected in the PV string 31 with the failure, and therefore, the value of the difference in temperature property expressed on the left side of the above-described formula is not 0. That is, the value obtained by substituting the current value detected in the PV string 31 with the failure into the Mathematical Formula 3 is not 0. Therefore, when the value obtained from the Mathematical Formula 3 is not 0, it can be considered that at least one of the i-th and i+1-th PV strings 31 has the failure so that the temperature property is abnormal.

Therefore, based on this deviation in temperature property, a degree of the deviation in temperature property is calculated by calculating a temperature property in a unit of the PV cell 311 for each of the i-th and i+1-th PV strings 31 by using the method as described later, and comparing this calculated result with an assumed temperature property in a unit of the PV cell 311. When this degree of the deviation is equal to or larger than a predetermined threshold, it can be estimated that the failure has occurred in any PV module 310 or PV cell 311 of this PV string 31. Note that the i+1-th PV string 31 is not necessarily adjacent to the i-th PV string 31, and may be a PV string 31 distant away from the PV string by a plurality of strings as long as the temperature difference can be ignored.

Figure 5:
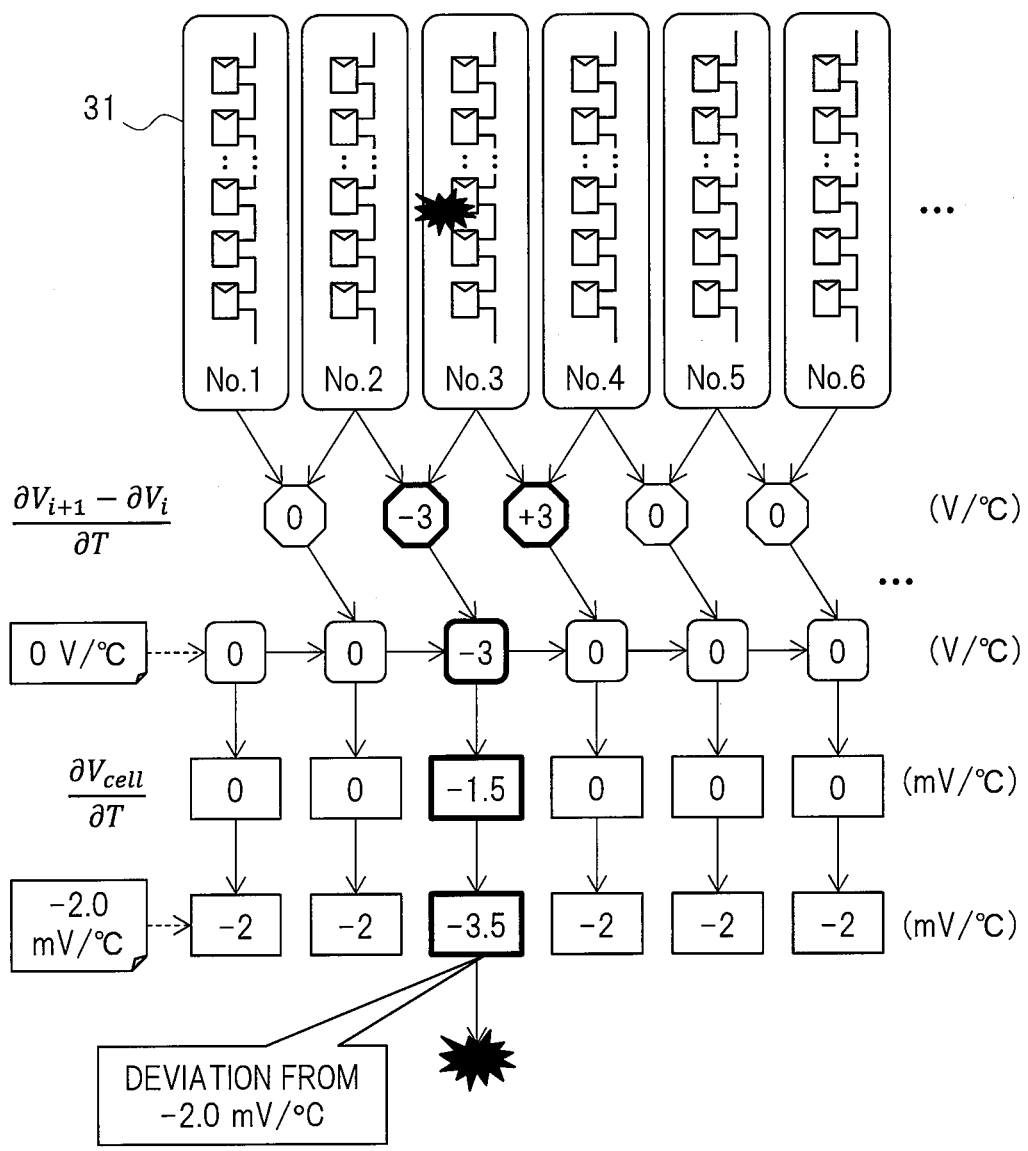
FIG. 5 is a diagram showing a general outline about an example of a method of detecting a failure in PV strings in the first embodiment of the present invention.

FIG. 5 is a diagram showing a general outline about an example of the method of detecting the failure in the above-described PV strings 31. On a first row from the top of the drawing, six PV strings 31 from No. 1 to No. 6 counted from an end in arrangement of the plurality of PV strings 31 are exemplarily illustrated. Among them, it is presumed that the failure has occurred in a part of the PV cells 311 of the PV string 31 of No. 3.

Here, a second row shows the results obtained by calculating values of difference in the temperature property of the current-voltage property between the adjacent PV strings 31 based on the formula expressed in the above-described Mathematical Formula 3 from the current values measured in the respective PV strings 31 with i=1 to 6. The example of FIG. 5 shows that a difference between No. 2 and No. 3 (−3 [V/T]) and a difference between No. 3 and No. 4 (+3 [V/T]) are not in a state of 0.

Here, when the temperature property for each PV string 31 shown on a third row in the drawing is obtained, a difference in temperature property as a reference value is set to 0 [V/T], and the temperature property of the PV string 31 of No. 1 at the end is temporarily set to a reference value (0 [V/T]), and besides, based on the temperature property, temporal values of the temperature property for the other PV strings 31 are sequentially obtained. For example, for the PV string 31 of No. 2 in the drawing, the temporal value of the temperature property of the PV string 31 of No. 2 is 0 [V/° C.] since the temporal value of the temperature property of the PV string 31 of No. 1 is 0 [V/° C.] and the difference in temperature property between the PV strings 31 of No. 1 and No. 2 is 0 [V/° C.].

Furthermore, for the PV string 31 of No. 3, the temporal value of the temperature property of the PV string 31 of No. 3 is −3 [V/° C.] since the temporal value of the temperature property of the PV string 31 of No. 2 is 0 [V/° C.] and the difference in temperature property between the PV strings 31 of No. 2 and No. 3 is −3 [V/° C.]. Also, for the PV string 31 of No. 4, the temporal value of the temperature property of the PV string 31 of No. 4 is 0 [V/° C.] since the temporal value of the temperature property of the PV string 31 of No. 3 is −3 [V/° C.] and the difference in temperature property between the PV strings 31 of No. 3 and No. 4 is +3 [V/° C.]. In the following, a temporal temperature property value of each PV string 31 can be obtained with a similar procedure.

A temperature property value in a unit of the PV cell 311 as shown on a fifth row in the drawing is calculated by dividing the temporal temperature property value for each PV string 31 obtained by such a procedure as described above by the number of PV cells 311 included in the PV string 31, calculating a temporal temperature property value ([mV/° C.]) in a unit of the PV cell 311 as shown on a fourth row in the drawing, and further adding the assumed temperature property value in the PV cell 311 to the calculated value. Note that the assumed temperature property in the PV cell 311 can be obtained by the following Mathematical Formula.

[Mathematical Formula 4]

$$\frac{\partial V_{oc}}{\partial T} \cong \frac{\frac{E_{go}}{q} [V] - \frac{V_{oc}}{N_{cell}} [V]}{298 [K]} \cong -2.0 \text{ mV/}^\circ \text{C.}$$

In the above-described formula, a term $V_{oc}$ is an open-circuit voltage of the PV string 31, and a term $V_{oc}/N_{cell}$ is obtained by dividing the open-circuit voltage by the number of PV cells 311 included in the PV string 31. Also, a term $E_{go}/q$ is a bandgap reference voltage, and is set to about 1.25 V in the present embodiment. Since the value of the open-circuit voltage $V_{oc}$ at normal temperature (298 [K]) and the value of the number $N_{cell}$ of the PV cells 311 included in the PV string 31 are known from the specification of the PV module or others, the assumed temperature property in the PV cell 311 can be previously calculated as a constant value, and is a value such as −2.0 [mV/° C.] in the present embodiment.

The temperature property value for each PV string 31 and the assumed temperature property value in the PV cell 311 obtained from the above-described procedure are compared with each other, so that it can be detected that the PV string 31 includes the PV module 310 with the failure when the deviation is equal to or larger than the predetermined threshold. The predetermined threshold can be set to a value such as 10% of an absolute value of the assumed temperature property in the PV cell 311 although not particularly limited thereto.

In this manner, by making the difference in the temperature property of the current-voltage property between the PV strings 31 adjacent or close to each other, the difference in the temperature distribution at the location in the large-scale system such as the mega solar system can be cancelled. Also, since the difference in the temperature property can be calculated only from current measurement values, it is not required to measure the voltage, so that a work and a facility cost for the measurement can be reduced, and the decrease in the accuracy of detection due to the requirement of the measurement for many parameters can be suppressed.

Figure 6:
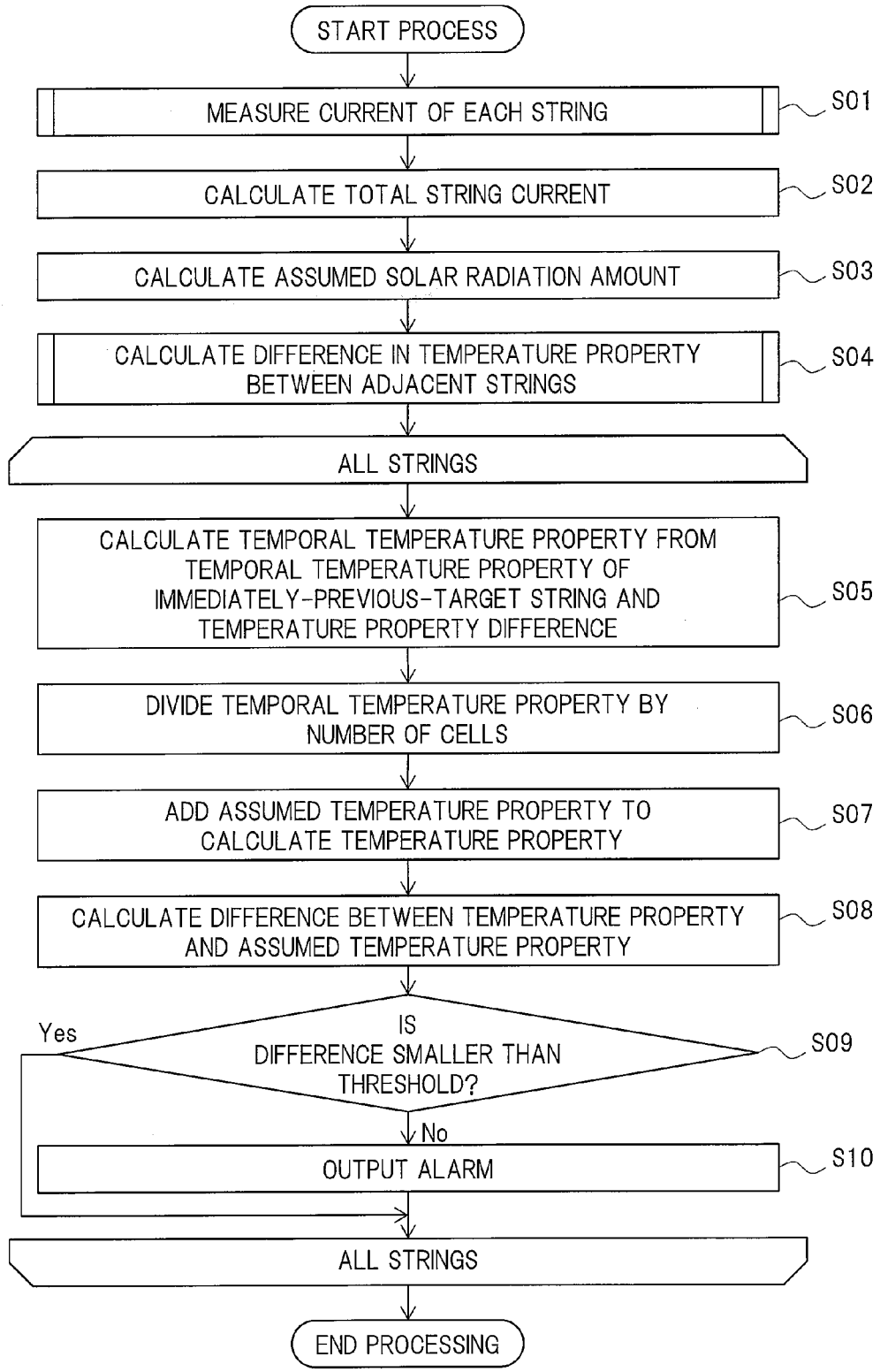
FIG. 6 is a flowchart showing a general outline about an example of a flow of process in mounting the failure detection method for the PV strings in the first embodiment of the present invention.

FIG. 6 is a flowchart showing a general outline about an example of a process flow used when the failure detection method for the PV strings 31 described above is performed. First, by the current detector 11 of the string monitor 10, based on an instruction from the sampling processing unit 12, the current of each PV string 31 is measured (S01). The measured current value is recorded in the memory 14 via the signal conversion transmission device 13.

Then, in the monitoring device or others, the current value recorded in the memory 14 is obtained via an external storage device or others or via communication, and it is determined whether the PV string 31 has the failure or not by the procedure described later based on the current value. As described above, not the monitoring device or others but the string monitor 10 itself may perform the process by using a CPU or others. Here, first, the current values for the respective PV strings 31 are totalized to calculate a total current (S02). Next, based on the total current value, an assumed solar radiation amount is calculated based on the formula expressed in the above-described Mathematical Formula 2 (S03).

Then, for each of the PV strings 31 arranged to be aligned, based on the formula expressed in the above-described Mathematical Formula 3, each difference in temperature property of the current-voltage property between the adjacent PV strings 31 is calculated (S04). As described above, the calculation may be made not only for the adjacent PV strings but also, for example, the PV strings 31 close to each other intermittently extracted every several ones.

Then, a loop process of sequentially repeating a process for all PV strings 31 as failure detection targets is started. The PV strings 31 as the targets here are the PV strings 31 to which the string monitor 10 is connected, and may not include all PV strings 31 in the PV system 1.

In the loop process, first, for the PV string 31 as a process target, a temporal temperature property value is calculated based on a temporal temperature property value obtained by a process as described later for an immediately-previous-target PV string 31 and on the value of the difference in temperature property from the immediately-previous-target PV string 31 (S05).

Specifically, as shown in FIG. 5, the temporal temperature property value for the process-target PV string 31 is calculated by adding the value of the difference in temperature property from the immediately-previous-target PV string 31 to the temporal temperature property value for the immediately-previous-target PV string 31. Note that, when the process-target PV string 31 is a beginning PV string 31, as described above, the value of the reference value for the temporal temperature property (0 [V/° C.] in the present embodiment) is set as a temporal temperature property value of the beginning PV string 31.

Next, a temporal temperature property value per the PV cell 311 is calculated (S06) by dividing the temporal temperature property value calculated for the process-target PV string 31 at step S05 by the number of PV cells 311 included in the process-target PV string 31. Furthermore, a non-temporal temperature property value per the PV cell 311 is calculated (S07) by adding the assumed temperature property value (−2.0 [mV/° C.] in the present embodiment) of the PV cell 311 calculated based on the formula expressed in the above-described Mathematical Formula 4 to the temporal temperature property value per the PV cell 311.

Then, a difference between the temperature property value per the PV cell 311 calculated at step S07 and the assumed temperature property value (−2.0 [mV/° C.] in the present embodiment) calculated based on the formula expressed in the above-described Mathematical Formula 4 is calculated (S08), and it is determined whether the difference value is smaller than a predetermined threshold or not (S09). When the value is smaller than the predetermined threshold, the process proceeds to a process for a next PV string 31 in the loop process without doing anything.

On the other hand, when the value is equal to or larger than the predetermined threshold, an alarm notifying of this is outputted (S10). An output form of the alarm is not particularly limited, and can, for example, display a notification message on a screen of the monitoring device, or can transmit the notification message to a predetermined E-mail address. The form may notify of this via voice or others. When the alarm output is completed, the process proceeds to a process for the next PV string 31 in the loop process. After the process is repeated for all PV strings 31 in the loop process, the failure detection process ends. Note that the above-described series of processes is desirably performed periodically with, for example, an instruction from the sampling processing unit 12 of the string monitor 10 or others as a trigger.

As described above, the PV inspection system having the string monitor 10 of the first embodiment of the present invention determines the failure by, for example, obtaining a difference in temperature property of the current-voltage property between those adjacent or close to each other for each PV string 31, calculating a temperature property of each PV string 31 based on this difference, and comparing this calculated result and an assumed temperature property. In this manner, even in the large-scale system such as the mega solar system, the influence of the difference in temperature distribution depending on the location can be cancelled. Also, since the value of the difference in temperature property can be calculated only from the current of each PV string 31, it is not required to measure the voltage, so that the accuracy of failure detection can be improved while the measurement is facilitated to reduce the cost.

The PV inspection system of the first embodiment described above obtains the solar radiation amount $p_a$, which is a parameter required to calculate the difference in temperature property of the current-voltage property between the PV strings 31 adjacent or close to each other as an assumed solar radiation amount calculated based on the total current $I_{op\_t}$, which is a total of currents of the respective PV strings 31 by the formula expressed in the above-described Mathematical Formula 2.

By contrast, a PV inspection system of a second embodiment of the present invention practically measures and obtains the solar radiation amount $p_a$ by an actinometer or others in order to reduce the influence of the difference in the distribution of the solar radiation amount depending on the location on the mega solar system and to more improve the accuracy of failure determination.

Figure 7:
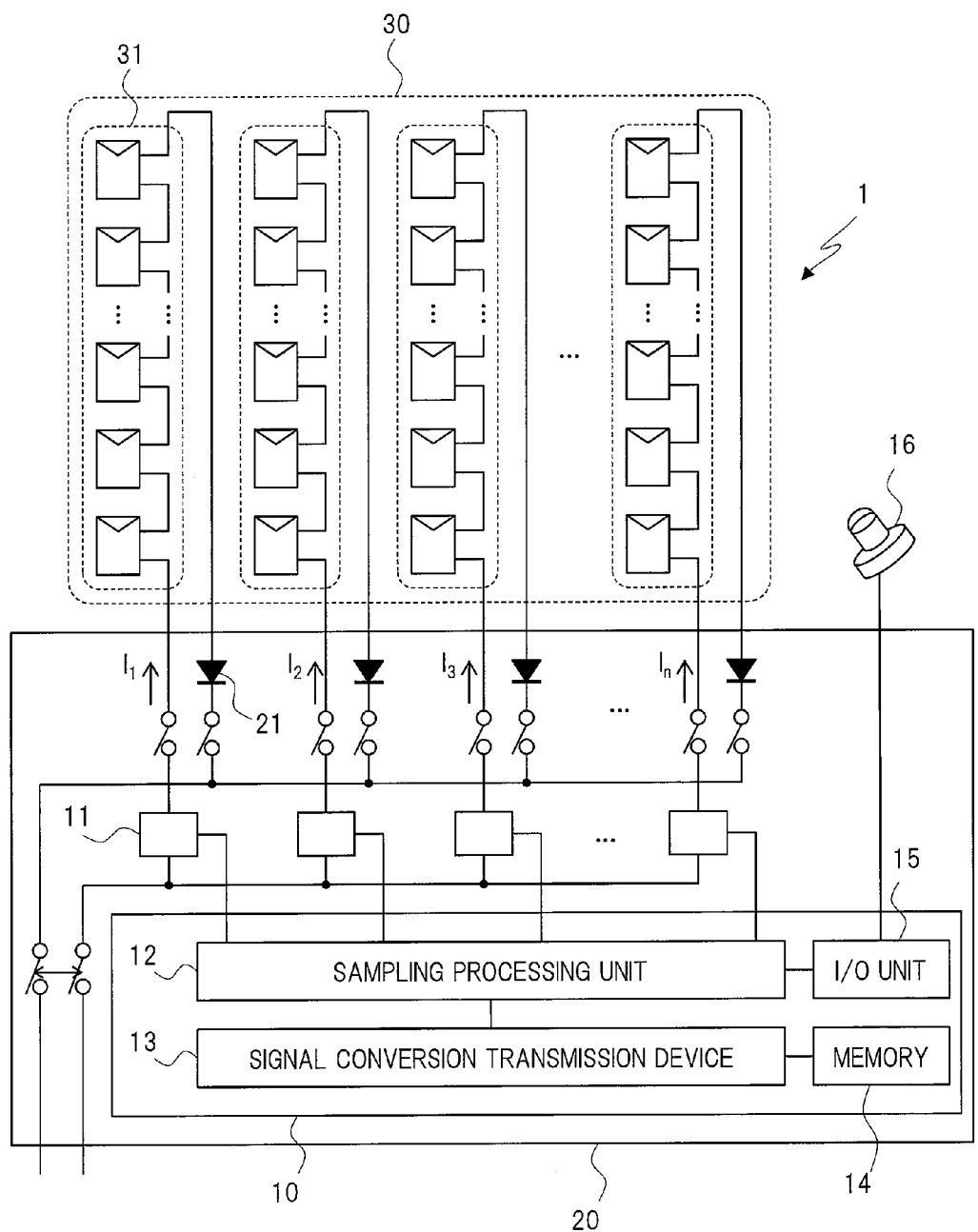
FIG. 7 is a diagram showing a general outline about an example of structure of a PV system having a PV inspection system according to a second embodiment of the present invention.

FIG. 7 is a diagram showing a general outline of an example of structure of a PV system 1 having a PV inspection system of the second embodiment of the present invention. In addition to the structure of the PV system 1 of the first embodiment shown in FIG. 1, the string monitor 10 of the present embodiment further has an I/O unit 15 which inputs/outputs a signal to/from an external device and an actinometer 16 connected thereto. In this manner, information about the solar radiation amount measured by the actinometer 16 can be used at the time of the process of failure detection.

Figure 8:
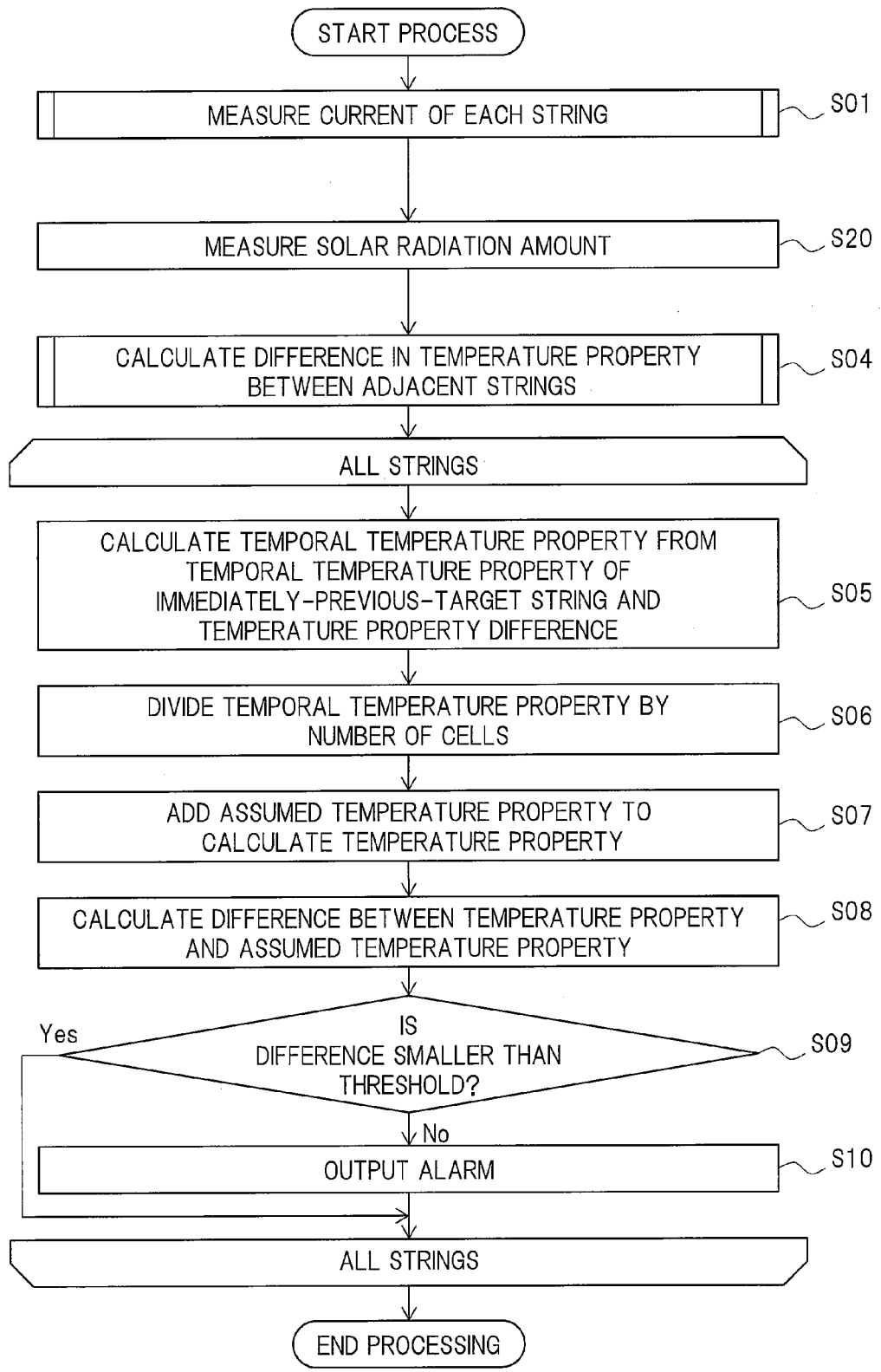
FIG. 8 is a flowchart showing an example of a flow of process in mounting the failure detection method for the PV strings in the second embodiment of the present invention.

FIG. 8 is a flowchart showing an example of a process flow used when the failure detection method for the PV strings 31 in the present embodiment is performed. Here, the processes at steps S02 and S03 in the process procedure of the first embodiment shown in FIG. 6, that is, the process of calculating the total current which is the total of currents of all the target PV strings 31 and the process of calculating the assumed solar radiation amount $p_a$ based on the total current are replaced by a process of practically measuring and obtaining the solar radiation amount $p_a$ by the actinometer 16 (S20). The other processes (S01 and S04 to S10) are similar to the process procedure of the first embodiment shown in FIG. 6, and therefore, repetitive description thereof is omitted.

In this manner, in place of the assumed solar radiation amount $p_a$ calculated from the total current of the PV strings 31, by using the solar radiation amount practically measured by the actinometer 16 as the solar radiation amount $p_a$ for the PV strings 31, the accuracy of failure detection can be improved. Note that the number of actinometers 16 is not limited to one, and a plurality of actinometers 16 may be set so as to correspond to the respective regions of the PV strings 31. In this case, the solar radiation amount measured by each actinometer 16 can be used as the solar radiation amount $p_a$ for the PV string 31 in the corresponding region.

In the PV inspection systems of the first and second embodiments described above, a current value of each PV string 31 is measured by the fixed or portable string monitor 10, and the difference in temperature property of the current-voltage property between the PV strings 31 adjacent or close to each other is calculated based on the measurement result. However, this case requires the current detector 11 for measuring the current values of all PV strings 31 in the target PV array 30. Therefore, in the case of the fixedly setting to the connection box 20, a setting space is required. Moreover, even in the case of the portable type, since the size of the string monitor 10 is increased and since many current detectors 11 are simultaneously set at the time of measurement, setting error tends to occur.

Thus, a PV inspection system of a third embodiment of the present invention has the string monitor 10 of the portable type, and has only two current detectors 11 such as CT sensors. In the present embodiment, the current values of a pair of the PV strings 31 adjacent or close to each other are each measured by the two current detectors 11, and the difference in temperature property of the current-voltage property in this pair is calculated by the method described above. Then, an operator shifts the pair of the measurement-target PV strings 31 one by one, and performs the similar measurement thereto. By sequentially performing this operation to all the measurement-target PV strings 31, processes equivalent to the processes up to step S04 in FIG. 6 or FIG. 8 described above can be performed. Thereafter, the failure can be detected by processes similar to those at step S05 in FIG. 6 or FIG. 8 and subsequent steps.

Figure 9:
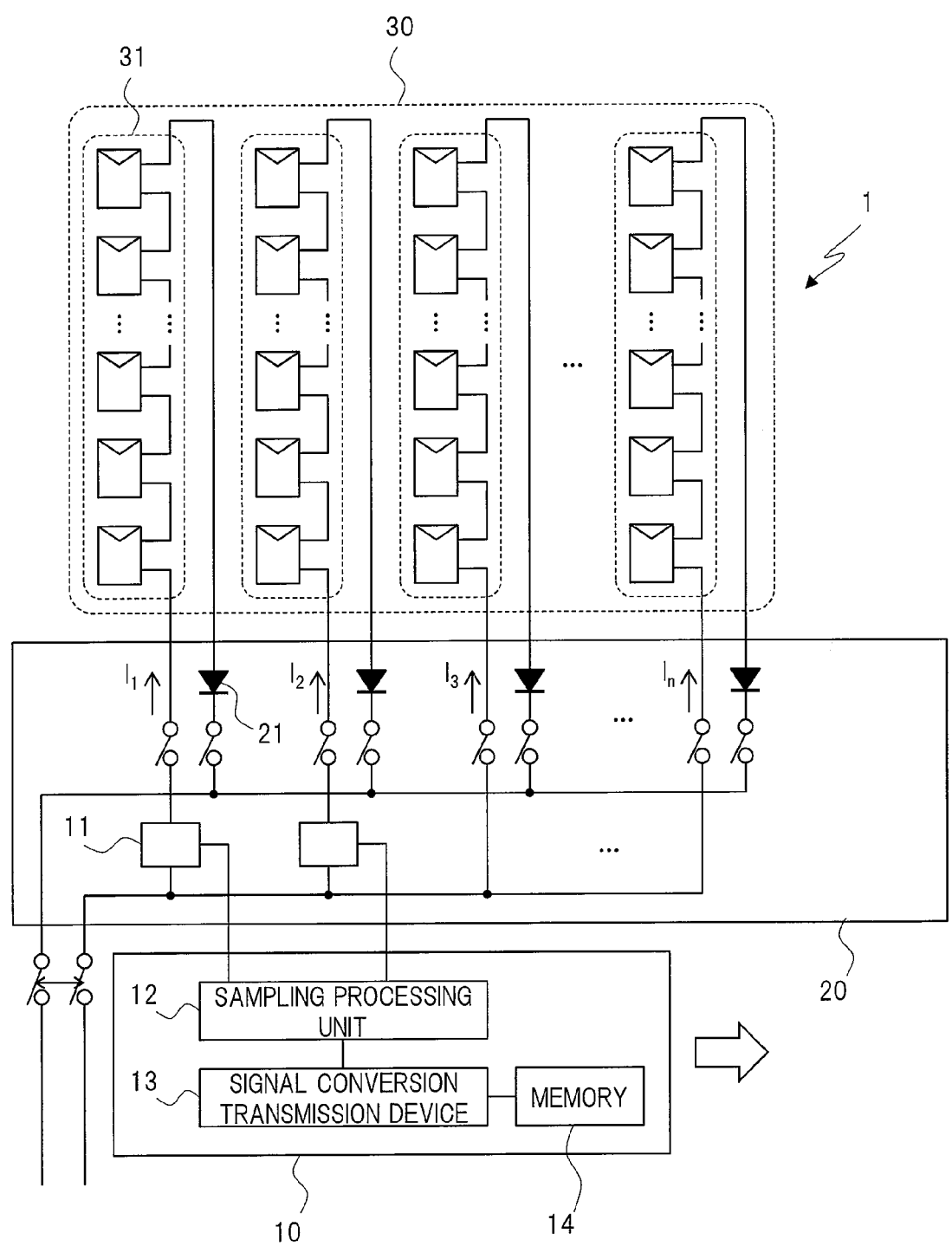
FIG. 9 is a diagram showing a general outline about an example of structure of a PV system having a PV inspection system according to a third embodiment of the present invention.
Figure 10:
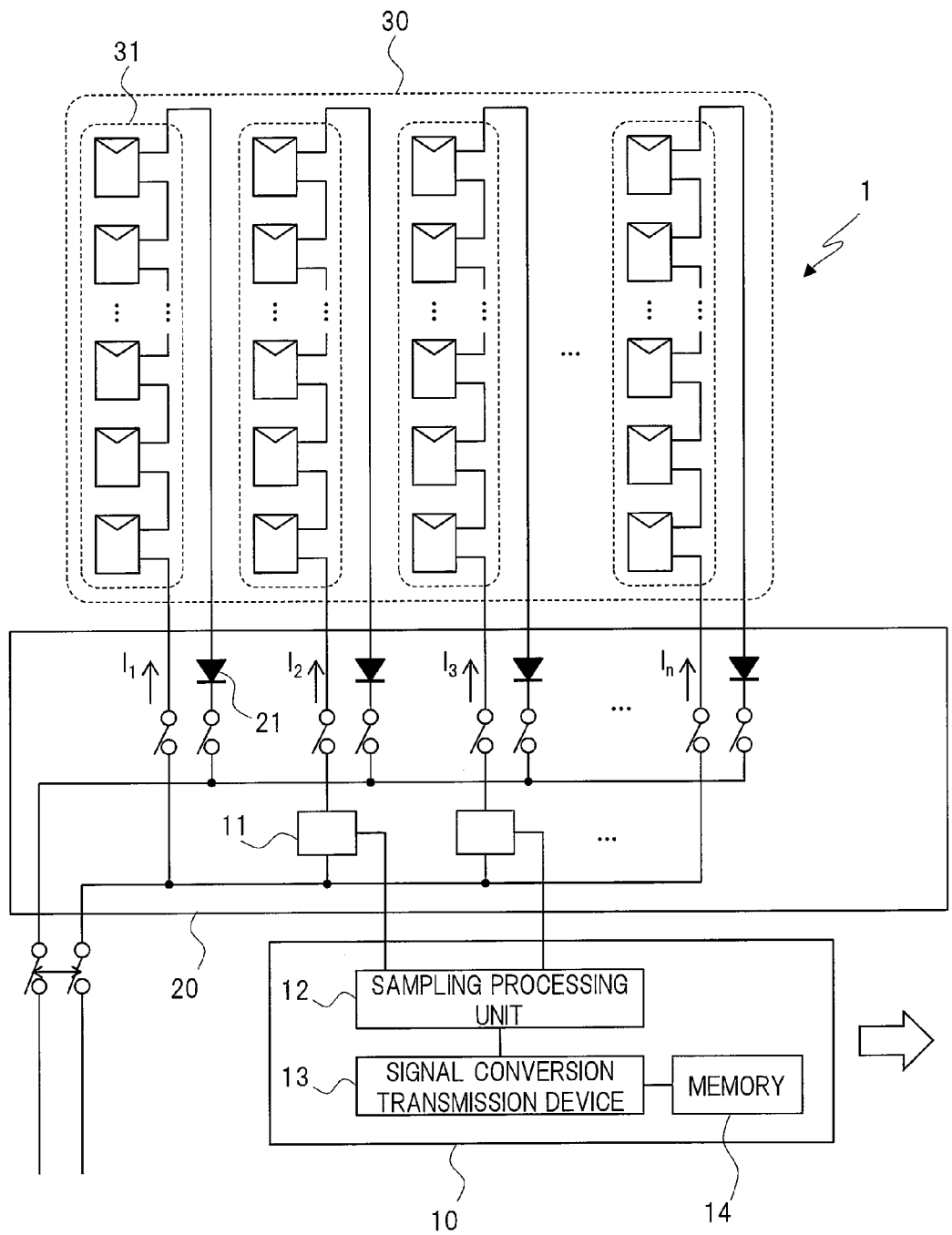
FIG. 10 is a diagram showing a general outline about an example of structure of a PV system having a PV inspection system according to the third embodiment of the present invention.
Figure 11:
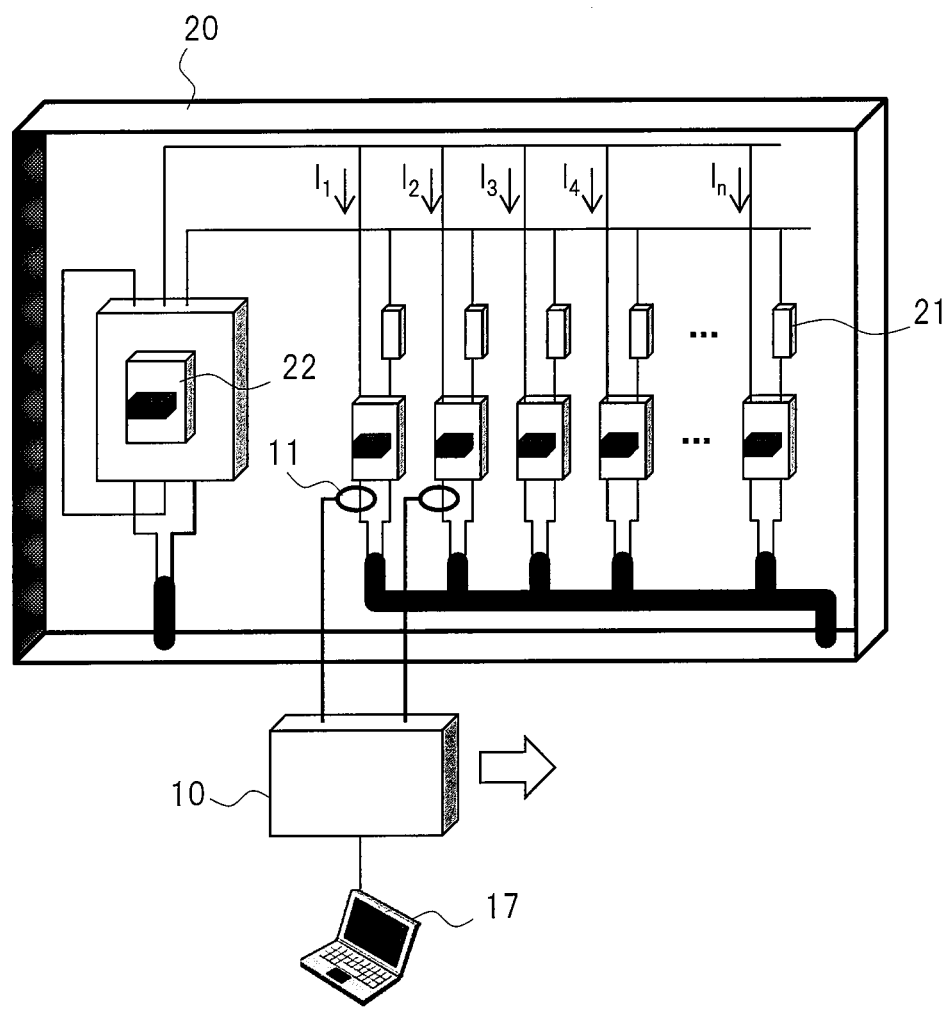
FIG. 11 is a diagram schematically showing a general outline about a specific example of structure at the time of inspection in the third embodiment of the present invention.
Figure 12:
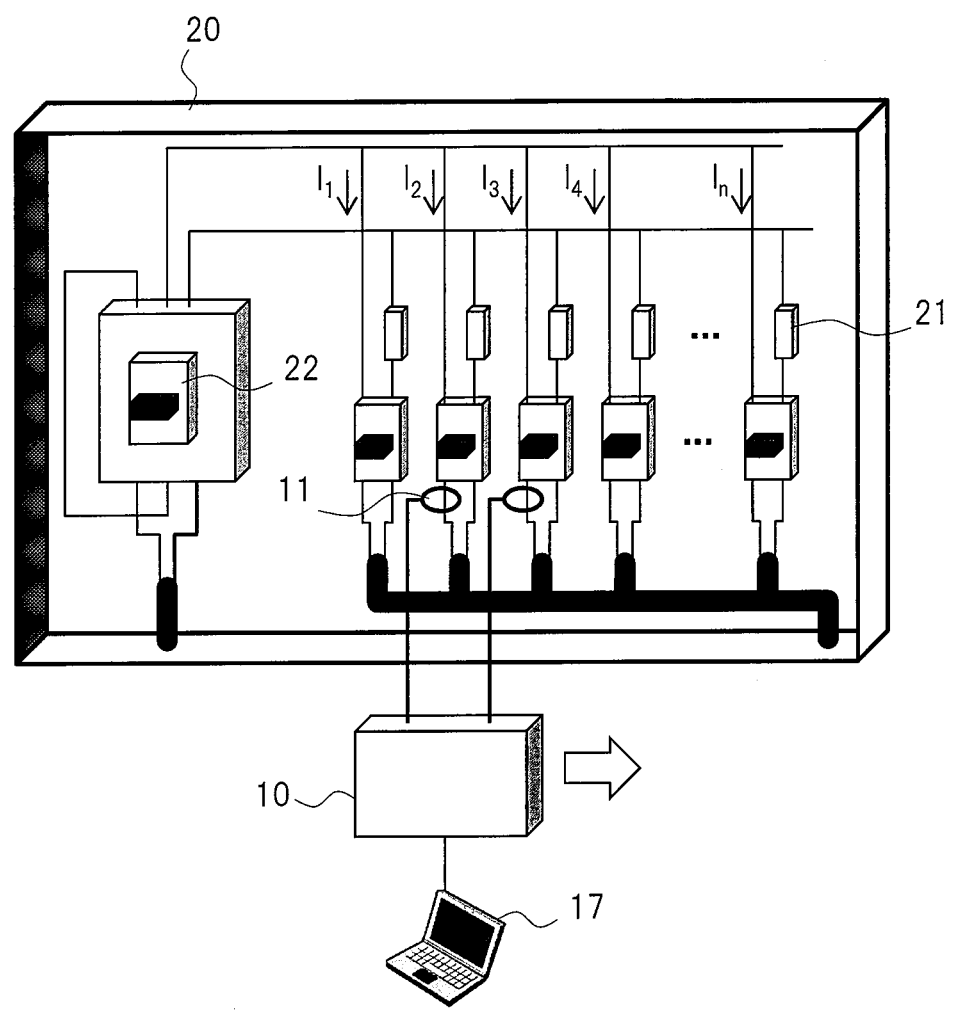
FIG. 12 is a diagram schematically showing a general outline about a specific example of structure at the time of inspection in the third embodiment of the present invention.

FIG. 9 and FIG. 10 are diagrams each showing a general outline of an example of structure of a PV system having the PV inspection system of the third embodiment of the present invention. A difference from the PV system in FIG. 1 in the above-described first embodiment is that the string monitor 10 has only two current measuring devices 11. The example of FIG. 9 shows the state in which two current values ($I_1$ and $I_2$) named sequentially from the left side are measured among the PV strings 31 of the PV array 30. The example of FIG. 10 shows the state in which current values ($I_2$ and $I_3$) are measured by shifting the pair of the measurement-target PV strings 31 by one from the example of FIG. 9. FIG. 11 and FIG. 12 are diagrams corresponding to the examples of FIG. 9 and FIG. 10, respectively, and each schematically showing a general outline of a specific example of structure at the time of inspection.

In this manner, the operator sequentially shifts the pair of the measurement-target PV strings 31 to measure the current values, and calculates the difference in temperature property of the current-voltage property, so that the results functionally similar to those of the first and second embodiments can be obtained. Also, in the present embodiment, by using the portable string monitor 10 having only two current measuring devices 11, the setting space of the string monitor 10 can be reduced, so that the PV system can be configured as being compact.

In the foregoing, the invention made by the inventors of the present invention has been concretely described based on the embodiments. However, it is needless to say that the present invention is not limited to the foregoing embodiments and various modifications and alterations can be made within the scope of the present invention. For example, the above-described embodiments have been explained for easily understanding the present invention, but are not always limited to the ones including all structures explained above. Also, a part of the structure of one embodiment can be replaced with the structure of the other embodiment, and besides, the structure of the other embodiment can be added to the structure of one embodiment. Further, the other structure can be added to/eliminated from/replaced with a part of the structure of each embodiment.

Also, each structure, function, processing unit, processing means, and others described above may be partially or entirely achieved by hardware by, for example, designing as an integrated circuit. Also, each structure, function, and others described above may be achieved by such a software as causing a processor to interpret and execute a program which achieves each function. Information about the program, a table, a file, and others achieving each function can be placed on a recording device such as a memory, a hard disk, or an SSD (Solid State Drive), or on a recording medium such as an IC card, an SD card, or a DVD.

Furthermore, each of the above-described drawings shows a control line and an information line considered as being required for description, and all control lines and information lines for the performance are not always shown. Practically, almost all structures may be considered as being connected to each other.

The present invention can be used in a PV inspection system and a PV inspection method of detecting a failure of a PV module or string.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A photovoltaic inspection system in a photovoltaic system having such a structure that a plurality of photovoltaic strings formed of one or plurality of series-connected photovoltaic modules are arranged to be aligned in parallel to each other, the photovoltaic inspection system detecting a failure of the photovoltaic strings, the photovoltaic inspection system comprising:
    a current detector which measures each of a first output current of a first photovoltaic string and a second output current of a second photovoltaic string; and
    a monitoring unit which calculates a second temperature property of the second photovoltaic string based on a value of the first output current and a value of the second output current and which determines whether the second photovoltaic string has the failure or not based on the second temperature property;
    wherein the monitoring unit calculates a difference between a temperature property of a current-voltage property of the first photovoltaic string and a temperature property of a current-voltage property of the second photovoltaic string based on the first output current, the second output current, and a solar radiation amount for the photovoltaic strings, and calculates the second temperature property based on the difference and a first temperature property of the first photovoltaic string.

2. The photovoltaic inspection system according to claim 1, wherein the monitoring unit calculates the solar radiation amount based on a total current which is a total of output currents of all detection targets of the photovoltaic strings.

3. The photovoltaic inspection system according to claim 1, further comprising an actinometer which measures the solar radiation amount.

4. The photovoltaic inspection system according to claim 1, wherein, when deviation between the second temperature property per photovoltaic cell included in the second photovoltaic string and an assumed temperature property of the photovoltaic cell is equal to or larger than a predetermined threshold, the monitoring unit determines that the second photovoltaic string has the failure.

5. The photovoltaic inspection system according to claim 1, wherein the first photovoltaic string and the second photovoltaic string are arranged so as to be adjacent to each other.

6. A photovoltaic inspection method in a photovoltaic system having such a structure that a plurality of photovoltaic strings formed of one or plurality of series-connected photovoltaic modules are arranged to be aligned in parallel to each other, the photovoltaic inspection system detecting a failure of the photovoltaic strings, the photovoltaic inspection method comprising the steps of:
    measuring each of a first output current of a first photovoltaic string and a second output current of a second photovoltaic string;
    calculating a second temperature property of the second photovoltaic string based on a value of the first output current and a value of the second output current;
    determining whether the second photovoltaic string has the failure or not based on the second temperature property; and
    obtaining a solar radiation amount for the photovoltaic strings;
    wherein the step of calculating the second temperature property includes the steps of:
        calculating a difference between a temperature property of a current-voltage property of the first photovoltaic string and a temperature property of a current-voltage property of the second photovoltaic string based on the first output current, the second output current, and the solar radiation amount; and
        calculating the second temperature property based on the difference and a first temperature property of the first photovoltaic string.

7. The photovoltaic inspection method according to claim 6, wherein, in the step of obtaining the solar radiation amount, the solar radiation amount is calculated based on a total current which is a total of output currents of all detection targets of the photovoltaic strings.

8. The photovoltaic inspection method according to claim 6, wherein the step of determination includes:
    calculating the second temperature property per one photovoltaic cell included in the second photovoltaic string; and
    determining that the second photovoltaic string has the failure when a deviation from an assumed temperature property of the photovoltaic cell is equal to or larger than a predetermined threshold.

9. A photovoltaic inspection system in a photovoltaic system having such a structure that a plurality of photovoltaic strings formed of one or plurality of series-connected photovoltaic modules are arranged to be connected in parallel to each other, the photovoltaic inspection system detecting a failure of the photovoltaic strings, the photovoltaic inspection system comprising:
    a current detector which measures each of a first output current of a first photovoltaic string and a second output current of a second photovoltaic string; and
    a monitoring unit which has means calculating solar radiation information of the photovoltaic string, which calculates a difference in a temperature property between the first photovoltaic string and the second photovoltaic string obtained by multiplying a logarithm of a ratio by a predetermined constant, the ratio being between a value obtained by subtracting a value of the first output current from a short-circuit current of the first photovoltaic string in a solar radiation amount calculated from the means calculating the solar radiation information and a value obtained by subtracting a value of the second output current from a short-circuit current of the second photovoltaic string in a solar radiation amount calculated from the means calculating the solar radiation information, which calculates a temperature property of the second photovoltaic string by adding the difference in the temperature property to a temperature property of the photovoltaic module, and which determines whether the second photovoltaic string has the failure based on the temperature property of the second photovoltaic string.

* * * * *